United States Patent [19]
Guedj

[11] Patent Number: 6,097,631
[45] Date of Patent: Aug. 1, 2000

[54] ELECTRICALLY ERASABLE FLOATING-GATE MEMORY ORGANIZED IN WORDS

[75] Inventor: Marc Guedj, Pont-Saint-Esprit, France

[73] Assignee: STMicroelectronics S.A., Gentilly, France

[21] Appl. No.: 09/275,327

[22] Filed: Mar. 24, 1999

[30] Foreign Application Priority Data

Mar. 24, 1998 [FR] France ................................ 98 03786

[51] Int. Cl.[7] .................................................. G11C 16/04
[52] U.S. Cl. ............................. 365/185.18; 365/185.05; 365/185.23
[58] Field of Search ................... 365/185.18, 185.05, 365/185.11, 185.23

[56] References Cited

U.S. PATENT DOCUMENTS

| | | | |
|---|---|---|---|
| 5,398,203 | 3/1995 | Prickett, Jr. .................. | 365/185.18 |
| 5,477,499 | 12/1995 | Van Buskirk et al. ......... | 365/185.18 |
| 5,671,176 | 9/1997 | Jang et al. .................... | 365/185.18 |
| 5,801,991 | 9/1998 | Keeney et al. ................. | 365/185.18 |
| 5,818,761 | 10/1998 | Onakado et al. .............. | 365/185.18 |

FOREIGN PATENT DOCUMENTS

| | | | |
|---|---|---|---|
| 0 741 415 A1 | 11/1996 | European Pat. Off. ...... | H01L 27/115 |
| 0 750 313 A1 | 12/1996 | European Pat. Off. ...... | G11C 16/04 |
| 96/34391 | 10/1996 | WIPO ........................... | G11C 7/00 |

OTHER PUBLICATIONS

Miyamoto et al., "An Experimental 5–V–Only 256–kbit CMOS EEPROM With a High–Performance Single–Polysilicon Cell", *IEEE Journal of Solid–State Circuits*, vol. 21, No. 5, (Oct. 1986), pp. 852–860.

Primary Examiner—Son T. Dinh
Attorney, Agent, or Firm—Theodore E. Galanthay; Allen, Dyer, Doppelt, Milbrath & Gilchrist, P.A.

[57] ABSTRACT

A floating-gate type memory uses voltages that are low in terms of absolute value with a reliable and compact word selection device. The device is compatible with Flash-EEPROM type memories. An N type well transistor is used as a word selection transistor.

24 Claims, 3 Drawing Sheets

ELECTRICALLY ERASABLE FLOATING-GATE MEMORY ORGANIZED IN WORDS

FIELD OF THE INVENTION

The invention relates to electrically erasable and programmable read-only memories known as EEPROMs. More particularly, it relates to an architecture of an electrical erasable floating-gate memory organized in words.

BACKGROUND OF THE INVENTION

The storage cells of EEPROMs are generally formed by floating-gate storage transistors and a selection transistor used to connect the storage transistor to a word line and a bit line. The EEPROMs use the principle of the non-volatile storage of charges at the floating gate of the floating-gate transistor. Conventionally, the writing (the term programming is also used) is done by the injection, by the tunnel effect, of electrons from the drain or the source into the floating gate (or from the floating gate into the drain or the source). The erasure is done by the injection, by the tunnel effect, of electrons from the floating gate into the drain or the source (or from the drain or the source into the floating gate).

There are also known EEPROMs called Flash-EEPROMs. In these memories, there is no selection transistor and the storage transistors are directly connected to the word lines and bit lines. In this case, a total erasure is carried out for the storage cells. This type of memory enables the reduction of the size of the memory for an equivalent storage capacity.

The injection of electrons from the drain (or source) into the floating gate of a storage transistor is done conventionally by grounding the drain (or source) of this transistor, applying a relatively high positive voltage (of about +15 volts) to its control gate to create an attraction field, and applying a moderate positive voltage (of 6 to 9 volts) at the source (or drain) to generate hot electrons. When a sufficiently large number of electrons has collected at the floating gate, the potential of the floating gate reaches the threshold potential of the transistor and prevents the passage of current in a read mode.

The injection of electrons from the floating gate into the drain (or source) is done by the application of a relatively high positive voltage (+15 volts) to the drain (or source), the control gate of the storage transistors being ground connected, and the source (or the drain) being left floating. The negative charges are then extracted from the floating gate and directed towards the drain (or source) by the Fowler-Nordheim effect. The thickness of the oxide between the floating gate and the drain (or the source) must be sufficiently low (about 100 Angstroms or less) to enable the injection by Fowler-Nordheim effect.

This type of memory has drawbacks, especially in the implementation of the ejection of the electrons from the floating gates:

the drain-substrate (or source-substrate) current during the ejection is relatively great and in practice, for large-capacity memories, makes it necessary to have a high positive voltage source that is external to the circuit, a relatively high reverse voltage is generated between the drains (or sources) and the substrate during the ejection. In practice, this dictates the use of drains (or sources) with dual diffusion, which reduces the density of implantation of the cells, and the application of a relatively high positive voltage during the erasure at the drains (or the sources) increases the probability of the creation of hot holes by an avalanche effect on the surface of the drain-substrate junction (or source-substrate junction). These holes are trapped in the thin oxide located beneath the floating gate.

For further details on these phenomena, reference may be made to the U.S. Pat. No. 5,077,691 by Advanced Micro Devices Inc. In this patent, it is proposed to erase the cells by the application of a relatively high negative voltage (−12 to −17 volts) to the control gates, a relatively low positive voltage (+0.5 to +5 volts) being applied on the sources, the substrate being connected to the ground, and the drains being left in a state of high impedance. Thus, it is possible to induce a Fowler-Nordheim effect, while at the same time keeping the reverse source-substrate voltage below +5 volts. The leakage current from the source to the substrate is reduced, enabling the memory to be supplied with a single external positive voltage source (+5 volts). Furthermore, this enables the use of sources comprising only one diffusion. This limits the surface area of the cells. Finally, it is possible to eliminate the creation of hot holes, thus increasing the reliability of the memory.

To reduce the voltages needed for the programming and erasure in terms of absolute value, the patent application EP-A-0 750 313 discloses a memory organized in words with a duplication of the word line. Thus, in this application, a P type transistor is associated with each word to control the gate of the floating-gate transistor. However, it appears to be necessary to add a second selection transistor to bias the gate of the floating-gate transistors when they are not controlled to obtain a more reliable memory.

SUMMARY OF THE INVENTION

It is an object of the invention to provide a floating-gate type memory organized in words using voltages that are relatively low in terms of absolute value. A second aim of the invention is to provide a selection device that is more reliable and compact than the one disclosed in the above mentioned European patent application. A third object of the invention is to provide a system compatible with the flash-EEPROM type memories.

The invention includes an N type well transistor as a selection transistor. Various bias values of the selection transistor enable the adaptation of the invention both to standard EEPROMS and to flash-EEPROMs.

An object of the invention is an electrically erasable and programmable floating-gate memory organized in N word lines and M*K bit lines, N, M and K being integers greater than 1. The memory comprises storage cells placed at the intersections of the word lines and bit lines, each storage cell comprising an N type floating-gate transistor to store electrical states. The storage cells are assembled in groups of K cells, the K cells of one and the same group are associated with one and the same word line and with K distinct bit lines. M selection lines are associated with the groups that share the same K bit lines. The memory comprises one N type well group transistor, associated with each group, connected to the selection line, associated with the group to bias the gates of the floating-gate transistors at potentials determined as a function of the selection or non-selection of the group with which the group transistor is associated and depending on the mode of operation, namely the read or write or erasure modes, of the memory.

Preferably, the memory comprises at least one well line connected to the wells of all or part of the group transistors to bias the wells at different potentials which are a function of the mode of operation, namely the read or write or erasure modes.

According to one embodiment, the memory comprises at least one reference line connected to the sources of all or a part of the floating-gate transistors either to bias the sources at a defined potential or to place the sources in a state of high impedance.

The invention can be applied especially to EEPROM type memories comprising selection transistors. In one alternative enabling the use of voltages that are low in terms of absolute value, the memory comprises N control lines parallel to the word lines to convey potentials different from the potentials conveyed by the word lines, each control line being associated with a different word line.

BRIEF DESCRIPTION OF THE DRAWINGS

The invention will be understood more clearly and other particular features and advantages shall appear from the following description, made with reference to the appended drawings, of which.

DETAILED DESCRIPTION OF THE PREFERRED EMBODIMENTS

Figure 1:
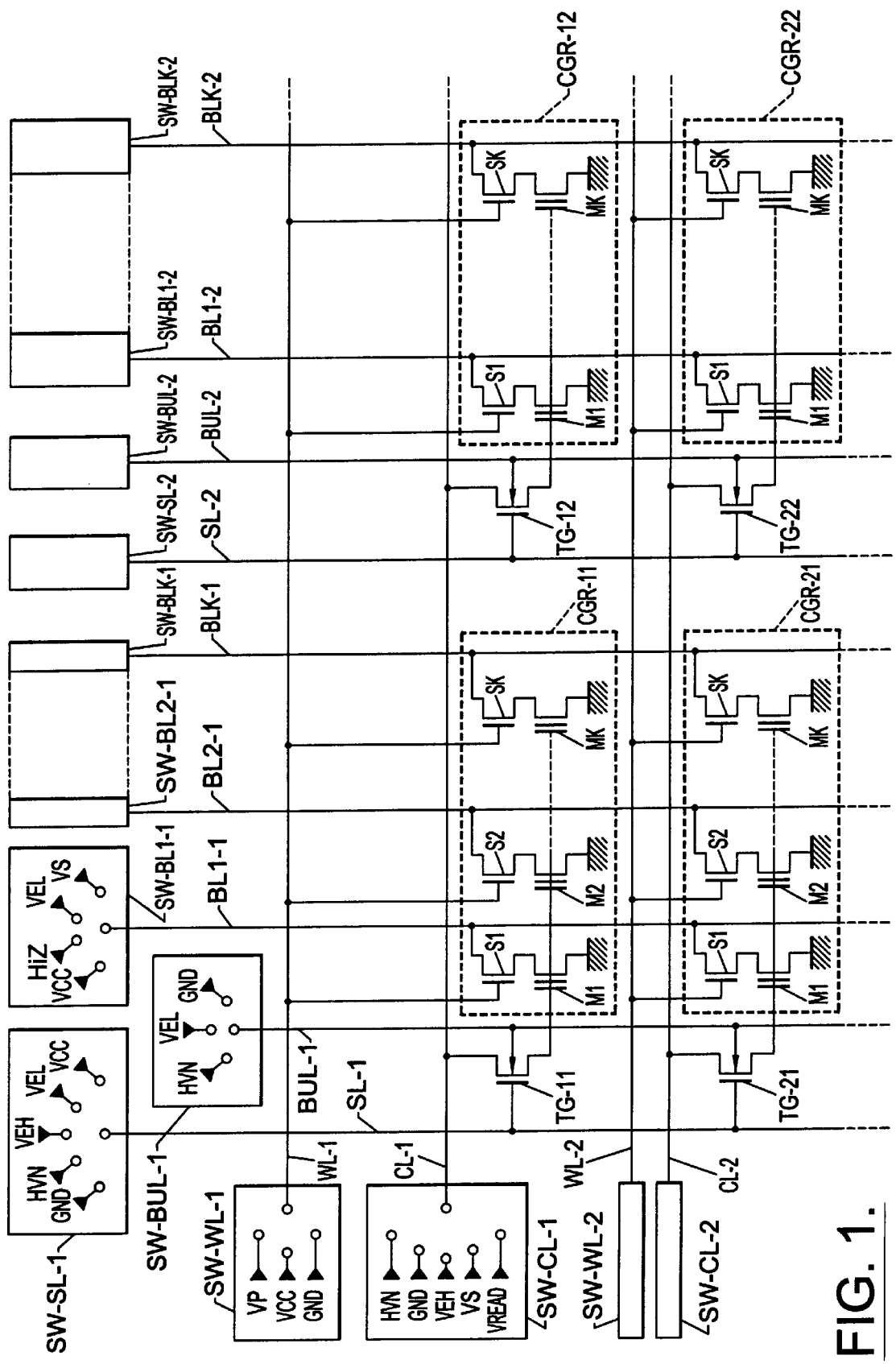
FIGS. 1 to 3 are schematic diagrams of three respective embodiments of the invention.

FIG. 1 shows a part of an EEPROM erasable by groups of K storage cells, where K is an integer. This memory is made according to the invention. Typically, K will be equal to a power of two, for example 8 or 16. This memory is organized in matrix form in N word lines WL-1 and WL-2 and M*K bit lines BL1-1, BL2-1, BLK-1, BL1-2 and BLK-2. N, M and K are integers (so as not to burden the description, the example is shown for M=N=2).

This memory comprises storage cells placed at the intersections of the word lines and bit lines, each of the cells being in an electrical state representing a binary logic state. The cells of one and the same group are connected to one and the same word line and to K distinct bit lines.

FIG. 1 shows a first word line WL-1 and first and second groups CGR-11 and CGR-12 of K storage cells connected to this first word line WL-1. The figure also shows a second word line WL-2 and third and fourth groups CGR-21 and CGR-22 of K storage cells connected to the second word line WL-2. Each of the K cells (which are not all shown) of each group is respectively connected to one bit line among K bit lines associated with the group. The bit lines bear the references BL1-1 to BLK-1 for the bit lines associated with the first and third groups CGR-11 and CGR-21 and the references BL1-2 to BLK-2 for the bit lines associated with the second and fourth groups CGR-12 and CGR-22. It will be understood, of course, that a memory made in accordance with the invention could contain several tens of thousands or several hundreds of thousands of groups of storage cells.

The K cells of each group CGR-11 to CGR-22 each comprise a selection transistor, respectively referenced S1 to SK, and a floating-gate storage transistor, respectively referenced M1 to MK. In the example described, it is assumed that the memory is made conventionally, using MOS technology, from a P type substrate. The selection transistors S1 to SK and the storage transistors M1 to MK are N type transistors. The selection transistors S1 to SK have their drains connected respectively to the bit lines BL1 to BLK associated with their group. Their control gates are connected to the word line WL associated with their group. Finally, each of the selection transistors S1 to SK has its source connected respectively to the drain of the transistors M1 to MK. The selection transistors S1 to SK enable the connection or insulation of the drains of the storage transistors M1 to MK from the bit lines BL1 to BLK.

The control gates of the floating-gate transistors M1 to MK of each group CGR are connected to one another and to the source of a group transistor TG. With each of the groups CGR-11, CGR-12, CGR-21 and CGR-22, there is associated a group transistor, respectively TG-11, TG-12, TG-21 and TG-22. In the invention, the group transistor TG is an N type well transistor.

Those skilled in the art know this type of transistor which is conventionally available in triple-well CMOS technology or BiCMOS technology. Since the substrate used is a P type substrate, the N type channel transistors are made in the same substrate, the P type channel transistors being made in N-doped wells, and the N type channel transistors being made in P doped wells placed within N doped wells. The particular feature of the N type well transistors is that it is possible to bias the well at a voltage different from that of the substrate.

The sources of the floating-gate transistors M1 to MK of the storage cells of the memory are all connected to the ground The group transistors TG-11 and TG-12 associated with the first and second groups CGR-11 and CGR-12 have their drains connected to a first control line CL-1. The group transistors TG-21 and TG-22 associated with the third and fourth groups CGR-21 and CGR-22 have their sources connected to a second control line CL-2.

The gates of the group transistors TG-11 and TG-21 associated with the first and third groups CGR-11 and CGR-21 are connected to a first selection line SL-1. The gates of the group transistors TG-12 and TG-22 associated with the second and fourth groups CGR-12 and CGR-22 are connected to a second selection line SL-2. The selection transistors TG have their wells connected to at least one well line BUL-1 and BUL-2.

The control lines CL-1 and CL-2 and selection lines SL-1 and SL-2 are conductive lines enabling the control gates of the storage transistors M1 to MK to be carried to different potentials by the group transistor TG, depending on whether or not a selection is made of the cells comprising these transistors for the reading, programming or erasure of their contents.

The memory furthermore comprises:

N word line selector switch circuits SW-WL-1 and SW-WL-2, each connected to one of the N word lines WL-1 and WL-2 to control the potentials of the word lines, N control line selector switch circuits SW-CL-1 and SW-CL-2, each connected to one of the N control lines CL-1 and CL-2 to control the potentials of the control lines, M*K bit line selector switch circuits SW-BL1-1 to SW-BLK-1 and SW-BL1-2 to SW-BLK-2, each connected to one of the M*K bit lines BL1-1 to BLK-1 and BL1-2 to BLK-2 to control the potentials of the bit lines, M selection line selector switch circuits SW-SL-1 and SW-SL-2, respectively connected to the first and second selection lines SL-1 and SL-2 to control the potentials of the selection lines, and at least one well selector switch circuit SW-BUL-1 and SW-BUL-2, connected to the at least one well line BUL-1 and BUL-2 to control the potential of the well line.

As stated above, the contents of the cells are determined through electrical characteristics of the floating-gate transistors. More specifically, the contents of the cells are qualified with respect to the presence or absence of electrons at the floating gates. To read a cell, a positive read voltage is imposed on the drain of its floating-gate transistor, the selection transistor of the cell being on and the source of the floating-gate transistor being connected to the ground. Depending on the presence or absence of electrons on the floating gate of the storage transistor, with its control gate being positively biased in an adequate way, the current flowing through the channel of this transistor is greater or smaller. By comparing this current, which flows through the associated bit line, with a reference current, the electrical state of the cell and therefore its information content are determined.

In the example described, it is assumed for example that the presence of electrons represents an erased state and that the absence of electrons represents a programmed state. It is equally possible to adopt the reverse convention. No description shall be given here of the devices (read amplifiers, word line decoders and bit line decoders, etc.) which conventionally form a memory, the invention relating specifically to the structure of the memory array.

There are three types of operation that can be singled out with regard to the cells. In a first mode, called a programming mode, floating-gate electrons of the storage transistors are injected into their drains. In a second mode, called an erasure mode, electrons are injected from the drains of the storage transistors into their floating gate. In a third mode, called a read mode, the storage transistors are biased so as to turn them on, the value of the current flowing through their channel depending on the electrical state of their floating gate.

In these different modes, the selection lines SL-1 and SL-2, control lines CL-1 and CL-2, well lines BUL-1 and BUL-2, word lines WL-1 and WL-2 and bit lines BL1-1 to BLK-1 and BL1-2 to BLK-2 are taken to different potentials depending on the mode of operation and on the selection or non-selection of the lines.

In the example illustrated, the following potentials are used:

- a ground potential GND=0 V and a supply potential VCC=+5 V (externally applied);
- a high erasure potential VEH=+15 V and a low erasure potential VEL=0 V,
- a programming potential HVN=−8 V,
- a word line selection potential VP in programming mode=+7 V,
- a bit line selection potential VS in read mode=+2 V,
- a read control potential VREAD=2.3 V, and
- a high impedance state is referenced HiZ.

Typically, the potentials GND and VCC are available at the memory connection pins. The other potentials are preferably produced internally to the memory. This enables the limiting of the number of connection pins of the memory. The potentials of absolute value greater than that of VCC are produced, for example, by means of voltage step-up circuits commonly called charge pumps whose construction is well known to those skilled in the art.

The N word line selector switch circuits SW-WL-1 and SW-WL-2 enable the potential of the word lines WL-1 and WL-2 to be taken to one of the potentials VCC, VEH, VCN, VP or GND.

The N control line selector switch circuits SW-CL-1 and SW-CL-2 enable the potential of the control lines CL-1 and CL-2 to be taken to one of the potentials VS, VEH, HVN, VREAD or GND.

The M*K bit line selector switch circuits SW-BL1-1 to SW-BLK-2 enable the potential of the bit lines BL1-1 to BLK-2 to be taken to one of the potentials VCC, VS or VEL or these lines to be placed in a state of high impedance HiZ.

The selection line selector switch circuits SW-SL-1 and SW-SL-2 enable the potential of the selection lines SL-1 to be taken to one of the potentials VCC, VEH, VEL, HVN or GND. The at least one well selector switch circuit SW-BUL-1 and circuit SW-BUL-2 enable the potential of the at least one well line BUL-1 and BUL-2 to be taken to one of the potentials HVN, VEL or GND. These selector switch circuits shall not be described in detail. Indeed, the making of the selector switch circuit is known to those skilled in the art.

The memory comprises N control lines CL-1 and CL-2 in such a way that all the groups of cells connected to one and the same word line WL-1 or WL-2 have their group selection transistors TG-11 to TG-22 connected to one and the same control line CL-1 or CL-2.

Advantageously, the selector switch circuits SW-CL-1, SW-CL-2, SW-SL-1 and SW-SL-2 are controlled in such a way that only one group of cells connected to one and the same word line WL-1 or WL-2 is connected simultaneously to the control line CL-1 or CL-2 associated with this word line. By adopting this procedure, the number of control gates of storage transistors M1 to MK simultaneously connected to one and the same control line CL-1 or CL-2 is limited to K. Consequently, the equivalent capacitance induced by this control line CL-1 or CL-2 is limited. Thus, a limit is placed on the build-up time to the potential of the connected control gates thus selected.

To find out which potentials have to be given by the different selector switch circuits to the different lines according to the mode of operation and selection of the different lines, those skilled in the art will refer to the following table:

|     | Writing Mode | | Erasing Mode | | Reading Mode | |
| --- | --- | --- | --- | --- | --- | --- |
|     | Selection | Non-Selection | Selection | Non Selection | Selection | Non-Selection |
| CL  | HVN | GND | VEH | VS  | VREAD | GND |
| SL  | GND | HVN | VEH | VEL | VCC | GDN |
| BUL | HVN | HVN | VEL | VEL | GND | GND |
| BL  | VCC | HiZ | VEL | HiZ | VS  | HiZ |
| WL  | VP  | GND | VCC | GND | VCC | GND |

By way of an example, we shall deal with the case where it is sought to write in the storage cell of the first group CGR-11. For this purpose, it is assumed that the first group has been erased beforehand, that the group to be written has been recorded beforehand in a buffer register (not shown) of the memory and that the address of the word corresponding to the first group CGR-11 has been stored beforehand in an address register (not shown). Those skilled in the art know that the contents of the address and buffer registers are used to determine which lines have to be selected or not selected to perform the write operations efficiently.

Thus, the first selection line SL-1 is selected and is at the potential GND. The other selection lines SL-2 are not selected and are at the potential HVN. The first control line CL-1 is selected and is at the potential HVN. The other control lines CL-2 are not selected and are at the potential GND.

The well lines BUL-1 and BUL-2 are at the potential HVN. The first word line WL-1 is selected and is at the potential VP. The other word lines WL-2 are not selected and are the potential GND.

The bit lines BL1-1 and BLK-1 associated with the first group CGR-11 are selected or not selected depending on the bit to be written. If, in the buffer register, a bit to be written is a "0", then the bit line associated with the bit is not selected and is at high impedance HiZ. If, in the buffer register, a bit to be written is a "1" then the bit line associated with the bit is selected and is at the potential VCC. The other bit lines BL1-2 to BLK-2 may, without distinction, be selected or not selected.

To carry out an erasure or a read operation, it is enough to determine which lines must be selected or not selected and refer to the above table. For greater details on the different modes of operation, reference may also be made to European patent application EP-A-0 750 313.

As described above, the invention has the advantage, as compared with the above mentioned European application, of using only one selection transistor per group of storage cells. Although it is an N type well transistor, its size is smaller than a P type transistor for, at equivalent conductivity, the P type transistors must have a channel of about 2 to 2.5 times wider than an N type transistor. This compensates for the size of the well which corresponds to two wells, one in the other.

Furthermore, it may be noted that the well lines are always at the same potential and that, consequently, they may both be connected together. If we use vertical and horizontal axial symmetries between groups of storage cells, it is possible to combine the selection transistors of neighboring groups in one and the same well. This has the effect of further reducing the amount of space required by the double-well.

It can also be noted that it is possible to use only one well selector switch circuit SW-BUL, but that this may have the effect of requiring a lengthier build-up time of the well voltage. A compromise has to be defined as a function of the temporal performance characteristics and surface area of the memory. The well lines have been shown parallel to the bit lines but it is quite possible to make them parallel to the word line.

It may be noted that the voltages used are of the same magnitude as in the above mentioned U.S. patent. It is possible, however, to use a high erasure potential VEH=+7 V and a low erasure potential VEL=−8 V. This means that it is no longer necessary to generate a voltage of 15 V and to add on an additional charge pump.

Figure 2:
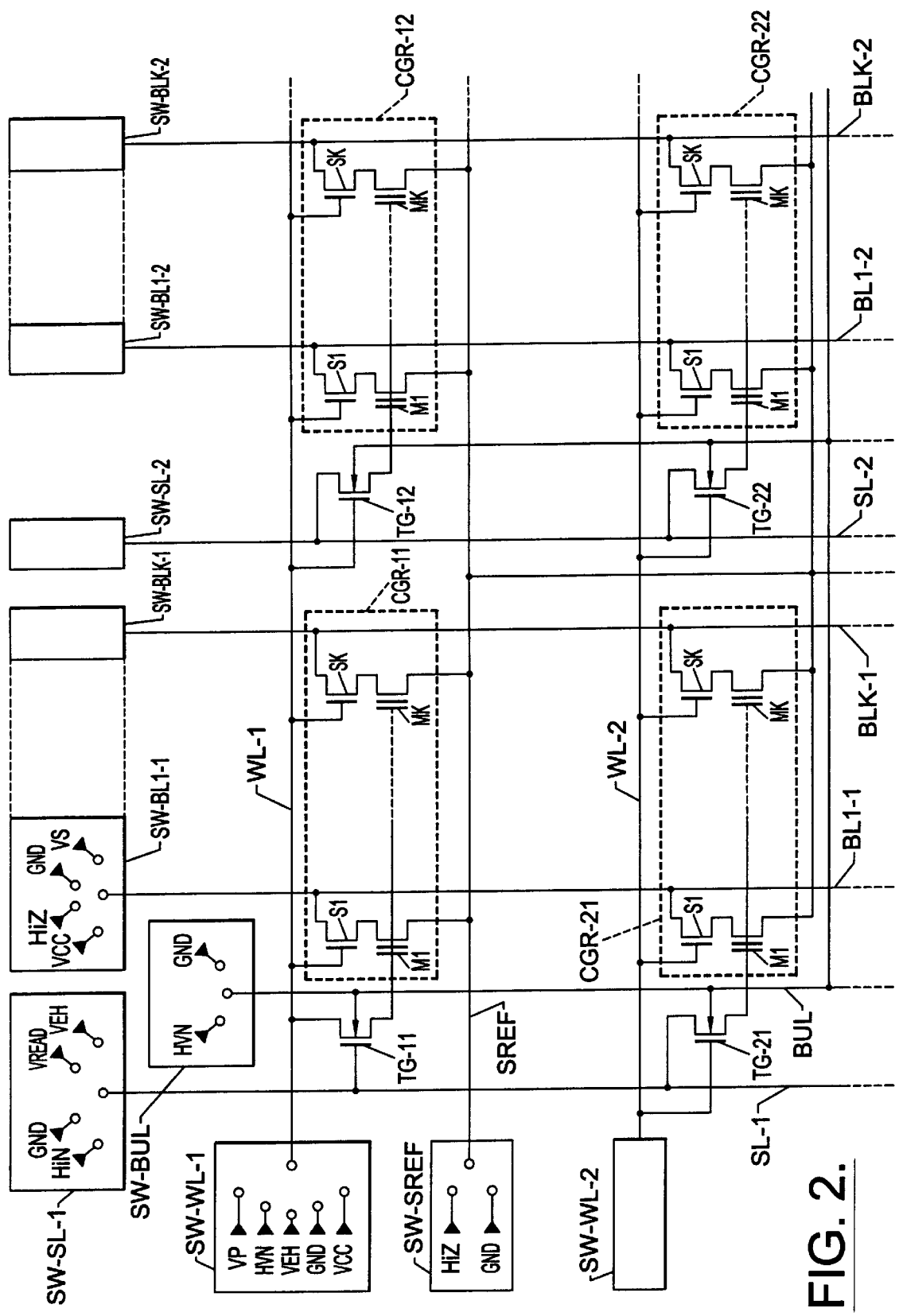

FIG. 2 shows a variant of the invention that makes it possible to obtain a more compact memory. FIG. 2 shows an example similar to the example given in FIG. 1. Various general indications that have been given above shall not be repeated hereinafter, but can be applied in the same way to the memory of FIG. 2.

In FIG. 2, the memory array comprises first and second word lines WL-1 and WL-2 and first to fourth groups CGR-11 to CGR-22 with K storage cells connected to first and second word lines WL-1 and WL-2 as indicated in FIG. 1. Each of the K cells of each group is respectively connected to one bit line among K bit lines associated with the group, bearing the references BL1-1 to BLK-2 as described above with reference to FIG. 1.

The K cells of each group of cells CGR-11 to CGR-22 each comprise a selection transistor respectively referenced S1 to SK and a floating-gate storage transistor respectively referenced M1 to MK. The K cells of FIG. 2 differ from FIG. 1 by the connection of the sources of the floating-gate transistors M1 to MK to a reference line SREF.

Four group transistors TG-11 to TG-22 are respectively associated with the first to fourth groups CGR-11 to CGR-22. The gates of the K storage transistors M1 to MK of one and the same group are connected together to the source of the group transistor TG associated with the group CGR.

The group transistors TG-11 and TG-12 associated with the first and second groups CGR-11 and CGR-12 have their gates connected to the first word line WL-1. The group transistors TG-21 and TG-22 associated with the third and fourth groups CGR-21 and CGR-22 have their gates connected to the second word line WL-2.

The drains of the group transistors TG-11 and TG-21 associated with the first and third groups CGR-11 and CGR-21 are connected to the first selection line SL-1. The drains of the group transistors TG-12 and TG-22 associated with the second and fourth groups TG-12 and CGR-22 are connected to a second selection line SL-2. The selection transistors TG have their wells connected to a well line BUL.

The memory further comprises:

N word line selector switch circuits SW-WL-1 and SW-WL-2, each connected to one of the N word lines WL-1 and WL-2 to control the potentials of the word lines, M*K bit line selector switch circuits SW-BL1-1 to SW-BLK-1 and SW-BL1-2 to SW-BLK-2, each connected to one of the M*K bit lines BL1-1 to BLK-1 and BL1-2 to BLK-2 to control the potentials of the bit lines, M selection line selector switch circuits SW-SL-1 and SW-SL-2, respectively connected to the first and second selection lines SL-1 and SL-2 to control the potentials of the selection lines, a well selector switch circuit SW-BUL, connected to the well line BUL to control the potential of the well line, and a reference selector switch circuit SW-SREF connected to the reference line SREF to control the potential of the reference line.

In these different embodiments, the selection lines SL-1 and SL-2, the reference line SREF, well line BUL, word line WL-1 and WL-2 and bit line BL1-1 to BLK-1 and BL1-2 to BLK-2 are taken to different potentials depending on the mode of operation and selection or non-selection of the line.

In the example illustrated in FIG. 2, the following potentials are used:

a ground potential GND=0 V and a supply potential VCC=+5 V (given from the exterior), a high erasure potential VEH=+15 V, a programming potential HVN=−8 V, a word line selection potential VP in programming mode=+7 V, a bit line selection potential VS in read mode=+2 V, a read control potential VREAD=2.3 V, and a high impedance state is referenced HiZ.

The N word line selector switch circuits SW-WL-1 and SW-WL-2 enable the potential of the word lines WL-1 and WL-2 to be taken to one of the potentials VCC, VEH, VCN, VP or GND.

The M*K bit line selector switch circuits SW-BL1-1 to SW-BLK-2 enable the potential of the bit lines BL1-1 to BLK-2 to be taken to one of the potentials VCC, VS or GND or these lines to be placed in a state of high impedance HiZ.

The selection line selector switch circuits SW-SL-1 and SW-SL-2 enable the potential of the selection lines SL-1 to be taken to one of the potentials VREAD, VEH, HVN or GND.

The well selector switch circuit SW-BUL enables the potential of the well line BUL to be taken to one of the potentials HVN or GND. The reference selector switch circuit SW-SREF makes it possible to carry the potential of the reference line SREF to the potential GND or place the reference line in high impedance HiZ.

To know which potentials have to be given by the different selector switch circuits to the different lines depending on the mode of operation and the selection of the different lines, those skilled in the art will refer to the following table:

positive read voltage is imposed on the drain of the floating-gate transistor, the selection transistor of the cell being on, and the source of the floating-gate transistor being connected to ground. Depending on the presence (whether great or small) of electrons on the floating gate of the storage transistor, its control gate being positively biased in an adequate way, the current flowing through the channel of this transistor is greater or smaller. By comparing this current, which flows through the associated bit line, with a reference current, the electrical state of the cell and therefore its information content are determined.

The flash-EEPROM type memories differ from the standard EEPROMs by a more precise control of the level of electrical charges during the programming and erasure operations. The fact of not using an associated selection transistor with each storage transistor requires that the transistor should not be in an on state when it is not selected.

In the example described, it is assumed, for example, that the presence of electrons represents an erased state and that the absence of electrons represents a programmed state. It is equally possible to adopt the reverse convention.

Figure 3:
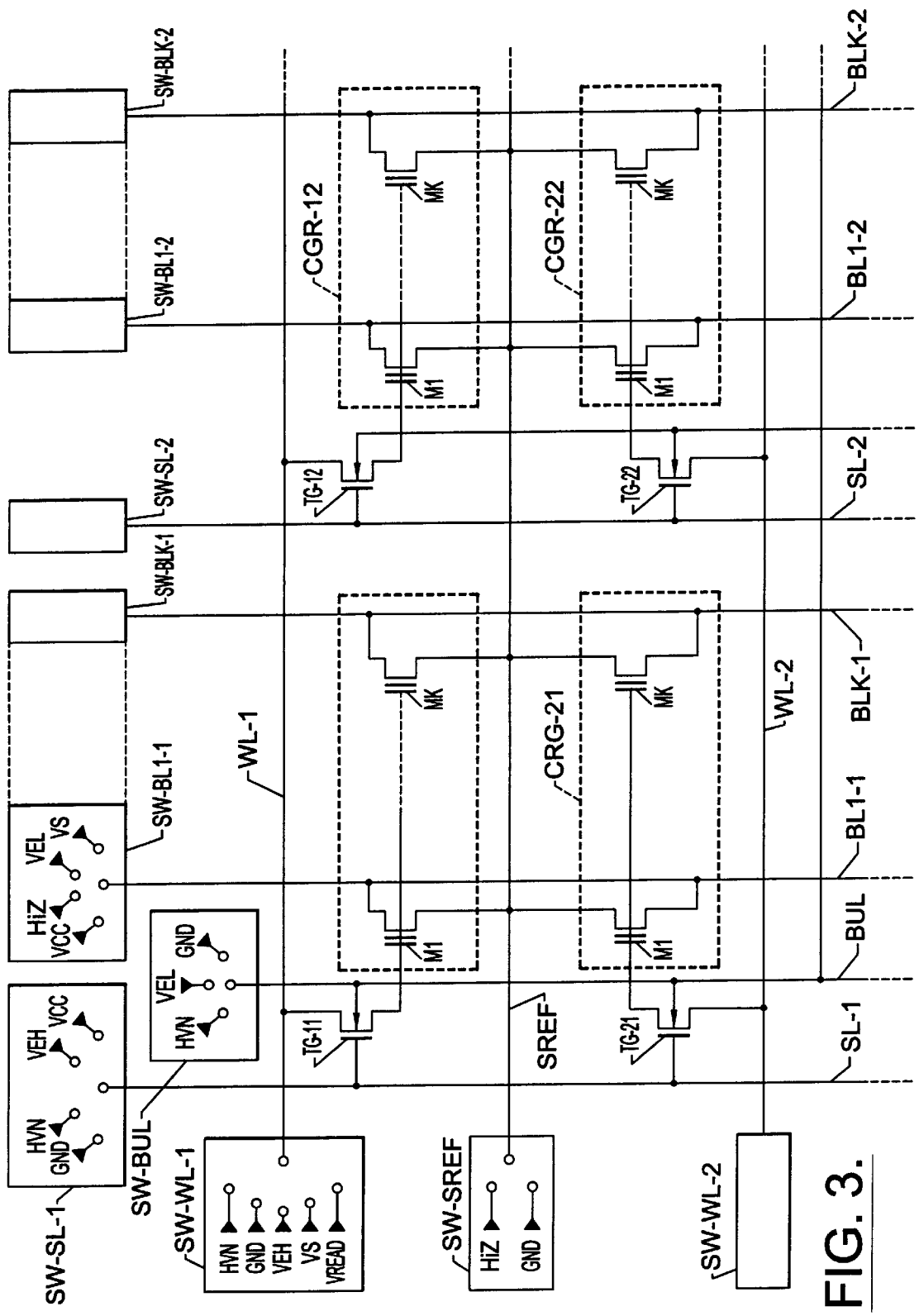
Figure 2:
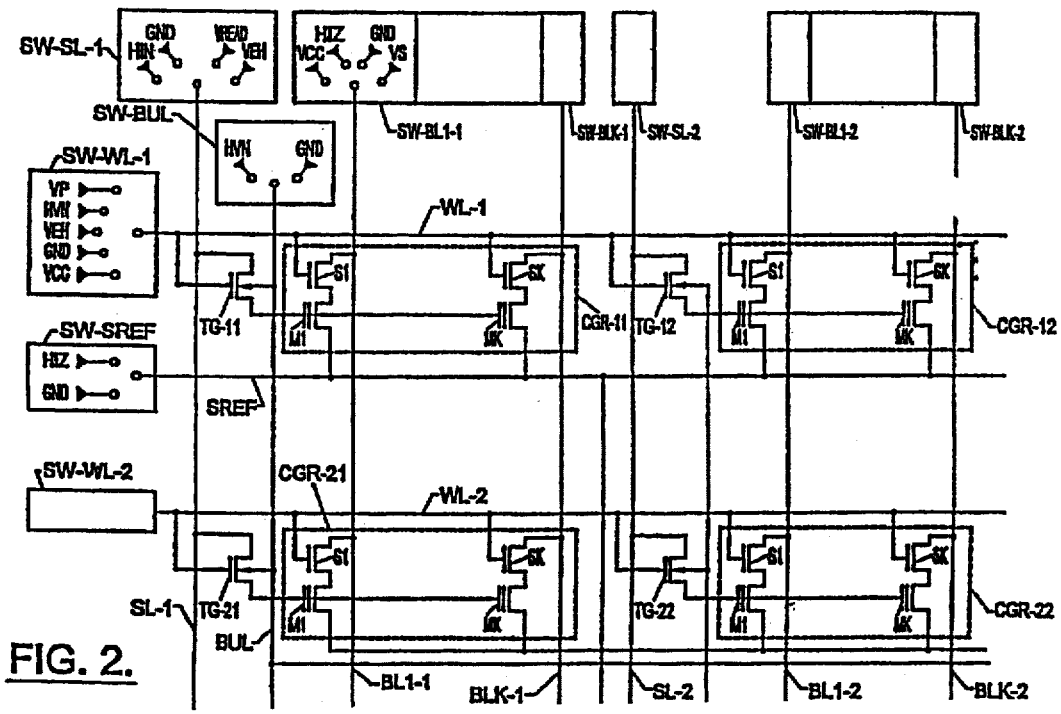

The memory of FIG. 3 is organized in matrix form in N word lines WL-1 and WL-2 and M*K bit lines BL1-1, BL2-1, BLK-1, BL1-2 and BLK-2, N, M and K being integers (in the example M=N=2).

This memory comprises storage cells placed at the intersections of the word lines and bit lines, each of the cells

|  | Writing Mode | | Erasing Mode | | Reading Mode | |
| --- | --- | --- | --- | --- | --- | --- |
|  | Selection | Non-Selection | Selection | Non Selection | Selection | Non-Selection |
| SREF | HiZ | HiZ | GND | GND | GND | GND |
| SL | HVN | GND | VEH | GND | VREAD | VREAD |
| BUL | HVN | HVN | GND | GND | GND | GND |
| BL | VCC | HiZ | GND | HiZ | VS | HiZ |
| WL | VP | MVN | VEH | GND | VCC | GND |

A procedure similar to that of FIG. 1 is carried out to write, erase or read a group of storage cells.

The circuit of FIG. 2 has one advantage as compared with the circuit of FIG. 1 in that it does not use the control line. This makes it possible to obtain a more compact design. Indeed, the reference line SREF does not constitute the addition of a conductive line for, in FIG. 1, the reference line corresponds to a ground line.

In FIG. 2, only one well selector switch circuit SW-BUL is used along with only one reference selector switch circuit SW-SREF. It goes without saying that it is possible to use several selector switch circuits if it is desired to improve the selector switching speed characteristics of the circuits.

FIG. 3 shows a memory made with flash-EEPROM type storage cells, namely with storage cells formed by a single storage transistor. The organization of the memory of FIG. 3 in words makes it possible to have a flash-EEPROM type memory that is programmable or erasable word-by-word. A flash-EEPROM type memory of this kind may therefore be compatible with the standard EEPROM memories in that they have the advantage of taking up a smaller surface area for equal storage capacity.

As in the case of the EEPROMs described above, the contents of the cells are determined through the electrical characteristics of the floating-gate transistors. More specifically, the contents of the cells will be qualified with reference to a varyingly high concentration of electrons (it is common in this case to speak of the presence or absence of electrons at the gate) at the floating gates. To read a cell, a being in an electrical state representing a binary logic state. The cells connected to one and the same word line and to K distinct bit lines are grouped together in one and the same group CGR-11 to CGR-22.

FIG. 3 shows a first word line WL-1 and first and second groups CGR-11 and CGR-12 of K storage cells associated with this first word line WL-1. The figure also shows a second word line WL-2 and third and fourth groups CGR-21 and CGR-22 of K storage cells associated with this second word line WL-2. Each of the K cells (which are not all shown) of each group is respectively connected to one bit line among K bit lines associated with the group, bearing the references BL1-1 to BLK-1 for the bit lines associated with the first and third groups CGR-11 and CGR-21 and the references BL1-2 to BLK-2 for the bit lines associated with the second and fourth groups CGR-12 and CGR-22. It will be understood of course that a memory made in accordance with the invention could contain several tens of thousands or several hundreds of thousands of groups of storage cells.

The K cells of each group CGR-11 to CGR-22 each comprise a floating-gate storage transistor respectively referenced M1 to MK. The storage transistors M1 to MK are N type transistors. The storage transistors M1 to MK have their drains respectively connected to the bit lines BL1 to BLK associated with their group. The sources of the transistors M1 to MK are connected together to a reference line SREF.

With each of the groups CGR-11, CGR-12, CGR-21 and CGR-22 there is associated a group transistor, respectively TG-11, TG-12, TG-21 and TG-22. The group transistor is an N type well transistor. The control gates of the floating-gate transistors M1 to MK of each group CGR are connected together and to the source of the group transistor TG.

The group transistors TG-11 and TG-12 associated with the first and second groups CGR-11 and CGR-12 have their drains connected to the first world line WL-1. The group transistors TG-21 and TG-22 associated with the third and fourth groups CGR-21 and CGR-22 have their sources connected to the second word line WL-2.

The gates of the group transistors TG-11 and TG-21 associated with the first and third groups CGR-11 and CGR-21 are connected to a first selection line SL-1. The gates of the group transistors TG-12 and TG-22 associated with the second and fourth groups CGR-12 and CGR-22 are connected to a second selection line SL-2. The selection transistors TG-11 to TG-22 have their wells connected to a well line BUL.

The selection lines SL-1 and SL-2 are conductive lines enabling the control gates of the storage transistors M1 to MK to be taken to different potentials depending on whether or not the cells selected comprise these transistors to read, program or erase their contents.

The memory further comprises:
  N word line selector switch circuits SW-WL-1 and SW-WL-2, each connected to one of the N word lines WL-1 and WL-2 to control the potentials of the word lines,
  M*K bit line selector switch circuits SW-BL1-1 to SW-BLK-1 and SW-BL1-2 to SW-BLK-2, each connected to one of the M*K bit lines BL1-1 to BLK-1 and BL1-2 to BLK-2 to control the potentials of the bit lines,
  M selection line selector switch circuits SW-SL-1 and SW-SL-2, respectively connected to the first and second selection lines SL-1 and SL-2, to control the potentials of the selection lines,
  a well selector switch circuit SW-BUL, connected to the well line BUL to control the potential of the well line, and
  a reference selector switch circuit SW-SREF connected to the reference line SREF to control the potential of the reference line.

In these different embodiments, the selection lines SL-1 and SL-2, reference line SREF, well line BUL, word line WL-1 and WL-2 and bit line BL1-1 to BLK-1 and BL1-2 to BLK-2 are taken to different potentials depending on the mode of operation and selection or non-selection of the line.

In the example illustrated in FIG. 3, the following potentials are used:
  a ground potential GND=0 V and a supply potential VCC=+5 V (given from the exterior),
  a high erasure potential VEH=+15 V and a low erasure potential VEL=0 volts,
  a programming potential HVN=−8 V,
  a bit line selection potential VS in read mode=+2 V,
  a read control potential VREAD=2.3 V, and
  a high impedance state is referenced HiZ.

The N word line selector switch circuits SW-WL-1 and SW-WL-2 enable the potential of the word lines WL-1 and WL-2 to be taken to one of the potentials VREAD, VEH, HVN, VS or GND.

The M*K bit line selector switch circuits SW-BL1-1 to SW-BLK-2 enable the potential of the bit lines BL1-1 to BLK-2 to be taken to one of the potentials VCC, VS or VEL or these lines to be placed in a state of high impedance HiZ.

The selection line selector switch circuits SW-SL-1 and SW-SL-2 enable the potential of the selection lines SL-1 to be taken to one of the potentials VCC, VEH, HVN or GND. The well selector switch circuit SW-BUL enables the potential of the well line BUL to be taken to one of the potentials HVN, VEL or GND.

The reference selector switch circuit SW-SREF enables the potential of the reference line SREF to be taken to the potential GND or the reference line to placed in high impedance HiZ.

To know which potentials have to be given by the different selector switch circuits to the different lines depending on the mode of operation and the selection of the different lines, those skilled in the art will refer to the following table:

|  | Writing Mode | | Erasing Mode | | Reading Mode | |
|---|---|---|---|---|---|---|
|  | Selection | Non-Selection | Selection | Non Selection | Selection | Non-Selection |
| SREF | HiZ | HiZ | GND | GND | GND | GND |
| SL | GND | HVN | VEH | GND | VCC | GND |
| BUL | HVN | HVN | VEL | VEL | GND | GND |
| BL | VCC | HiZ | VEL | HiZ | VS | HiZ |
| WL | HVN | GND | VEH | VS | VREAD | GND |

A procedure similar to that of FIG. 1 is performed to carry out an elementary operation for the writing, erasure or reading on a group of storage cells. However, those skilled in the art know that to control the erasure (and write operations respectively) of the flash-EEPROM type memories, the operation proceeds by an alternation of elementary erasure (and respectively write) operations and elementary read operations to ascertain that the erasure (and write) operations respectively have been properly completed.

There also exists known ways of having flash-EEPROM type memories using variable write and/or erasure voltages. It is necessary in this case to use potentials VEH and/or VEL and/or HVN which develop in a specified frequency range.

One improvement of the circuit of FIG. 3 results from using a high erasure potential VEH=+7 V and a low erasure potential VEL=−8 V. This means that it is no longer necessary to generate a voltage of 15 V and to add a further charge pump.

Various alternative embodiments of the invention described in the present application are possible by using the different indications given throughout the description. It is possible in particular to make use of different horizontal and vertical axes of symmetry to obtain a compact memory.

Furthermore, those skilled in the art can use different conventions of programmed or erased cells. In this case, the voltages used for the erasure have to be applied for write operations and vice versa.

It is also possible that the differential voltages to be applied to the storage transistors may be different from those used in the present application. Those skilled in the art will therefore have to adapt them according to their needs.

One operational adaptation designed to obtain page write operations and page or block erasure operations is also possible. Indeed, if there are as many registers forming a data buffer as there are bit lines, it is possible to obtain a writing by page by selecting a word line on all the selection lines. For the erasure by page, the procedure will be the same. By contrast, it is also possible to select several word lines in order to enable a block erasure comprising several word lines.

That which is claimed is:

1. An electrically erasable and programmable floating-gate memory organized in N word lines and M*K bit lines, N, M and K being integers greater than 1, the memory comprising:

respective storage cells placed at the intersections of the word lines and bit lines, each storage cell comprising an N type floating-gate transistor to store electrical states, the storage cells being assembled in groups of K cells, the K cells of a group being associated with a word line and with K distinct bit lines;

M selection lines associated with groups sharing same K bit lines; and a respective N type well group transistor connected to a selection line of each group to bias gates of the floating-gate transistors at potentials determined as a function of a selection or non-selection of the group depending on a mode of operation from among at least one of read, write and erasure modes.

2. A memory according to claim 1, wherein each group transistor has a source connected to gates of all the floating-gate transistors of the group.

3. A memory according to claim 1, further comprising at least one well line connected to at least one of the group transistors to bias the well thereof at different potentials as a function of the mode of operation.

4. A memory according to claim 1, further comprising at least one reference line connected to the floating-gate transistors to bias sources thereof at a defined potential or to place the sources in a state of high impedance.

5. A memory according to claim 1, wherein each storage cell further comprises a selection transistor for connecting a drain of the floating-gate transistor to the bit line associated with the cell; and wherein the selection transistor has a gate connected to the word line associated with the cell.

6. A memory according to claim 5, wherein the group transistor has a drain connected to a selection line associated with the group; and wherein the group transistor has a gate connected to the word line associated with the group.

7. A memory according to claim 5, further comprising N control lines parallel to the word lines to convey potentials different from the potentials conveyed by the word lines; and wherein each control line is associated with a different word line.

8. A memory according to claim 7, wherein the group transistor has a drain connected to an associated control line.

9. A memory according to claim 7, wherein the group transistor has a gate connected to a selection line associated with the group.

10. A memory according to claim 1, wherein the floating-gate transistor has a drain connected to the bit line associated with the storage cell.

11. A memory according to claim 9, wherein the group transistor has a drain connected to a word line.

12. An electrically erasable and programmable floating-gate memory organized in N word lines and M*K bit lines, N, M and K being integers greater than 1, the memory comprising:

respective storage cells placed at the intersections of the word lines and bit lines, each storage cell comprising an N type floating-gate transistor to store electrical states, the storage cells being assembled in groups of K cells, the K cells of a group being associated with a word line and with K distinct bit lines;

M selection lines associated with groups sharing same K bit lines;

a respective N type well group transistor connected to a selection line of each group to bias gates of the floating-gate transistors at potentials determined as a function of a selection or non-selection of the group depending on a mode of operation from among at least one of read, write and erasure modes; and at least one well line connected to at least one of the group transistors to bias the well thereof at different potentials as a function of the mode of operation.

13. A memory according to claim 12, wherein each group transistor has a source connected to gates of all the floating-gate transistors of the group.

14. A memory according to claim 12, further comprising at least one reference line connected to the floating-gate transistors to bias sources thereof at a defined potential or to place the sources in a state of high impedance.

15. A memory according to claim 12, wherein each storage cell further comprises a selection transistor for connecting a drain of the floating-gate transistor to the bit line associated with the cell; and wherein the selection transistor has a gate connected to the word line associated with the cell.

16. A memory according to claim 15, wherein the group transistor has a drain connected to a selection line associated with the group; and wherein the group transistor has a gate connected to the word line associated with the group.

17. A memory according to claim 15, further comprising N control lines parallel to the word lines to convey potentials different from the potentials conveyed by the word lines; and wherein each control line is associated with a different word line.

18. A memory according to claim 17, wherein the group transistor has a drain connected to an associated control line.

19. A memory according to claim 17, wherein the group transistor has a gate connected to a selection line associated with the group.

20. A memory according to claim 12, wherein the floating-gate transistor has a drain connected to the bit line associated with the storage cell.

21. A memory according to claim 20, wherein the group transistor has a drain connected to a word line.

22. A method for operating an electrically erasable and programmable memory comprising respective storage cells placed at the intersections of word lines and bit lines, each storage cell comprising an N type floating-gate transistor to store electrical states, the storage cells being assembled in groups of K cells, the K cells of a group being associated with a word line and with K distinct bit lines; M selection lines associated with groups sharing same K bit lines; and a respective N type well group transistor connected to a selection line of each group, the method comprising the step of:

using the group transistors to bias gates of the floating-gate transistors at potentials determined as a function of a selection or non-selection of the group depending on a mode of operation from among at least one of read, write and erasure modes.

23. A method according to claim 22, wherein the memory further comprises at least one well line connected to at least one of the group transistors; and further comprising the step of using the at least one well line to bias the wells of the group transistors at different potentials as a function of the mode of operation.

24. A method according to claim 22, wherein the memory further comprises at least one reference line connected to the floating-gate transistors; and further comprising the step of using the at least one reference line to bias sources of the floating-gate transistors at a defined potential or to place the sources in a state of high impedance.

* * * * *

UNITED STATES PATENT AND TRADEMARK OFFICE
CERTIFICATE OF CORRECTION

PATENT NO. : 6,097,631           Page 1 of 2
DATED : August 1, 2000
INVENTOR(S) : Marc Guedj It is certified that error appears in the above-identified patent and that said Letters Patent is hereby corrected as shown below:

Drawings,
FIG. 2, delete FIG. 2 as issued, replace with FIG. 2 as shown below:

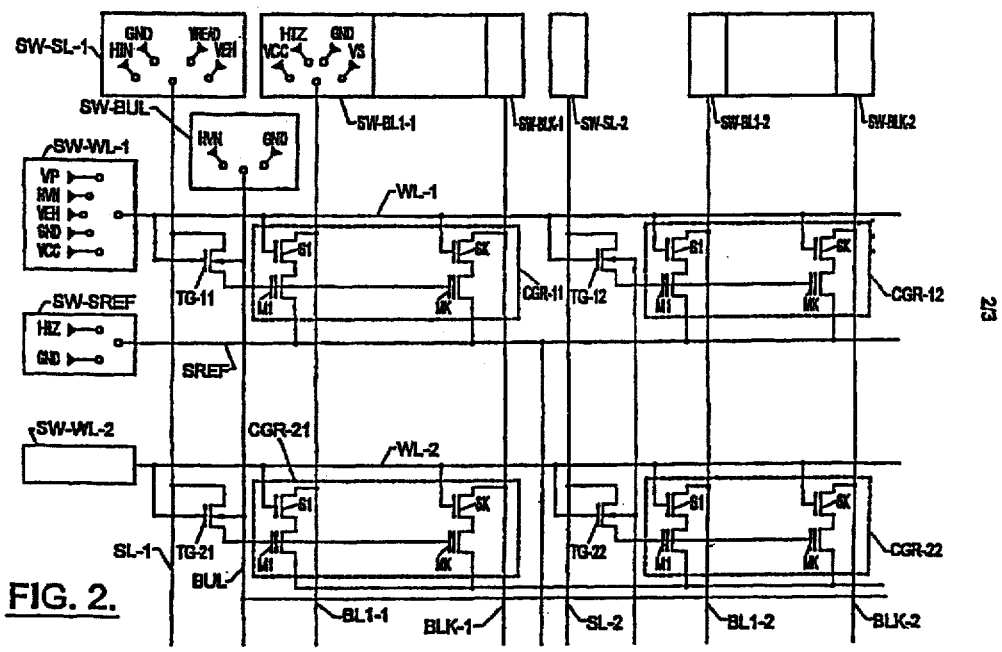

FIG. 2.

Signed and Sealed this

Fourth Day of December, 2001

Attest:

*Nicholas P. Godici*

NICHOLAS P. GODICI
Attesting Officer   Acting Director of the United States Patent and Trademark Office